United States Patent
Baars et al.

(10) Patent No.: US 9,634,017 B1
(45) Date of Patent: Apr. 25, 2017

(54) SEMICONDUCTOR STRUCTURE INCLUDING A NONVOLATILE MEMORY CELL AND METHOD FOR THE FORMATION THEREOF

(71) Applicant: GLOBALFOUNDRIES Inc., Grand Cayman (KY)

(72) Inventors: Peter Baars, Dresden (DE); Hans-Juergen Thees, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/959,382

(22) Filed: Dec. 4, 2015

(51) Int. Cl.
    *H01L 27/115* (2006.01)
    *H01L 29/423* (2006.01)
    (Continued)

(52) U.S. Cl.
CPC .... *H01L 27/11521* (2013.01); *G11C 14/0063* (2013.01); *G11C 16/24* (2013.01); *H01L 21/0217* (2013.01); *H01L 21/0223* (2013.01); *H01L 21/02164* (2013.01); *H01L 21/26513* (2013.01); *H01L 21/28273* (2013.01); *H01L 21/31053* (2013.01); *H01L 21/3212* (2013.01); *H01L 21/76224* (2013.01); *H01L 27/11* (2013.01); *H01L 27/11526* (2013.01); *H01L 29/4236* (2013.01); *H01L 29/42328* (2013.01);
(Continued)

(58) Field of Classification Search
CPC ......... H01L 29/42328; H01L 29/42332; H01L 29/42336; H01L 29/42344; H01L 29/42352; H01L 27/115; H01L 27/11521; H01L 27/11524; H01L 29/66824; H01L 29/788
See application file for complete search history.

(56) References Cited

U.S. PATENT DOCUMENTS 8,969,940 B1 * 3/2015 Yater ................. H01L 29/42328
    257/314
9,276,006 B1 * 3/2016 Chen .................. H01L 29/7885
(Continued)

OTHER PUBLICATIONS

Anvo-Systems Dresden non-volatile SRAM brochure.
(Continued)

*Primary Examiner* — Dale E Page
*Assistant Examiner* — John Bodnar
(74) *Attorney, Agent, or Firm* — Amerson Law Firm, PLLC

(57) ABSTRACT

A semiconductor structure includes a nonvolatile memory cell including a first nonvolatile bit storage element and a second nonvolatile bit storage element which have a common source region provided in a semiconductor material and a common control gate structure. Each nonvolatile bit storage element includes a drain region, a channel region, a select gate structure, a floating gate structure and an erase gate structure. The channel region has a select gate side portion and a floating gate side portion. The select gate structure is provided at the select gate side portion of the channel region and the floating gate structure is provided at the floating gate side portion of the channel region. The erase gate structure is provided above the select gate structure and adjacent the floating gate structure. The control gate structure extends above the floating gate structures of the first and second nonvolatile bit storage elements.

15 Claims, 10 Drawing Sheets

(51) Int. Cl.

| | |
|---|---|
| *H01L 29/40* | (2006.01) |
| *H01L 27/11* | (2006.01) |
| *H01L 29/51* | (2006.01) |
| *H01L 21/28* | (2006.01) |
| *H01L 21/265* | (2006.01) |
| *H01L 27/11521* | (2017.01) |
| *H01L 29/49* | (2006.01) |
| *H01L 29/788* | (2006.01) |
| *H01L 27/11526* | (2017.01) |
| *G11C 14/00* | (2006.01) |
| *G11C 16/24* | (2006.01) |
| *H01L 21/321* | (2006.01) |
| *H01L 21/3105* | (2006.01) |
| *H01L 21/02* | (2006.01) |
| *H01L 21/762* | (2006.01) |

(52) U.S. Cl.
CPC ........ *H01L 29/495* (2013.01); *H01L 29/4916* (2013.01); *H01L 29/518* (2013.01); *H01L 29/7883* (2013.01)

(56) References Cited

U.S. PATENT DOCUMENTS

| | | | |
|---|---|---|---|
| 2002/0175394 A1* | 11/2002 | Wu | H01L 27/115 257/510 |
| 2013/0171786 A1* | 7/2013 | Shroff | H01L 21/28273 438/266 |
| 2014/0210511 A1* | 7/2014 | Bartling | H03K 19/173 326/38 |
| 2016/0087056 A1* | 3/2016 | Wu | H01L 29/42328 257/320 |
| 2016/0225777 A1* | 8/2016 | Cheng | H01L 27/11521 |

OTHER PUBLICATIONS

Meena et al., "Overview of emerging nonvolatile memory technologies," Nanoscale Research Letters, 9:526, 2014.

Tehrani et al., "Advancement in Charge-Trap Flash Memory Technology," 978-1-4673-6169-9, IEEE, 2013.

* cited by examiner

SEMICONDUCTOR STRUCTURE INCLUDING A NONVOLATILE MEMORY CELL AND METHOD FOR THE FORMATION THEREOF

BACKGROUND

1. Field of the Disclosure

Generally, the present disclosure relates to the field of integrated circuits including memory devices and, more particularly, to integrated circuits including nonvolatile memory.

2. Description of the Related Art

Nonvolatile memory such as, for example, flash memory, may be used in various storage devices such as, for example, secure digital memory cards (SD cards), USB sticks, solid state drives (SSDs) and internal memory of various electronic devices such as, for example, mobile phones, tablet computers, media players, etc. Other applications of nonvolatile memory include embedded systems, wherein nonvolatile memory is provided in addition to logic circuits and/or volatile memory such as static random access memory (SRAM) and/or dynamic random access memory (DRAM) and wherein the nonvolatile memory, the logic circuits and the volatile memory are physically and electrically integrated on a single substrate, for example, a single monolithic silicon substrate. Embedded systems including nonvolatile memory find applications in various fields such as, for example, in automotive, industry and communication market segments. Integrating nonvolatile memory, logic circuitry and volatile memory on a single substrate may help to improve performance and reduce costs compared to solutions wherein nonvolatile memory and logic circuitry are provided on separate substrates, for example, due to an elimination of input/output buffers, design flexibility, lower power consumption and/or system-on-a-chip capability.

Examples of a nonvolatile memory cell of nonvolatile memory may include a source region and a drain region that are formed in a semiconductor material. Between the source region and the drain region, a channel region is provided that is doped differently than the source region and the drain region. Over the channel region, a floating gate and a select gate are provided. Over the floating gate, a control gate is provided, and an erase gate is provided over the source region. The select gate, the floating gate, the control gate and the erase gate are electrically insulated from each other and from the source, drain and channel regions by electrically insulating materials. The floating gate may be surrounded by electrically insulating material so that it is electrically floating. The source region, the drain region, the select gate, the control gate and the erase gate may have respective electrical contacts connected thereto so that voltages may be applied to the source region, the drain region and the select, control and erase gates for performing operations of programming, erasing and reading the nonvolatile memory cell.

For programming the nonvolatile memory cell, voltages adapted for creating a relatively strong, substantially vertically oriented electrical field in the channel region between the select gate and the floating gate and a current providing electrons to the channel region may be applied to the select and control gates and the source and drain regions, which may cause a hot electron injection into the floating gate so that the floating gate is electrically charged. The electric charge of the floating gate may, in particular, depend on the voltage applied to the drain region. Since the floating gate is electrically floating, the charge injected into the floating gate may remain in the floating gate and may create an electric field that acts on a portion of the channel region below the floating gate.

For reading data from the nonvolatile memory cell, a voltage may be applied between the source region and the drain region, and a voltage adapted for creating an electrically conductive channel below the select gate may be applied to the select gate. Due to the influence of the electric charge in the floating gate on the portion of the channel region below the floating gate, a conductivity of the channel region and a current flowing between the source region and the drain region may be influenced by the electric charge on the floating gate. Thus, it may be determined if an electric charge has been injected into the floating gate by means of a programming operation.

For erasing the nonvolatile memory cell, a relatively high positive voltage may be applied to the erase gate so that a Fowler-Nordheim tunneling of electrons from the floating gate to the erase gate may be obtained. Thus, an electric charge injected into the floating gate in the programming of the nonvolatile memory cell may be removed from the floating gate.

Integrating nonvolatile memory cells as described above and field effect transistors which may be used, for example, in logic circuits and/or static random access memory cells may have some issues associated therewith, in particular when the field effect transistors are provided in accordance with high-k metal gate technology. Field effect transistors provided in accordance with high-k metal gate technology may include a gate structure including a gate insulation layer that is formed of a high-k dielectric material having a greater dielectric constant than silicon dioxide, such as, for example, hafnium dioxide, and a gate electrode including a metal such as, for example, lanthanum, lanthanum nitride, titanium nitride, aluminum and/or aluminum nitride. In particular, when high-k metal gate field effect transistors are formed in accordance with a gate-first approach, wherein the gate structures of the field effect transistors are formed before ion implantation processes are performed for forming source and drain regions of the field effect transistors, integration issues may occur since gate stacks that are used for some or all of the gates of the nonvolatile memory cells are different from those used for forming the gate structures of the high-k metal gate field effect transistors. Moreover, there may be integration issues when the gates of the nonvolatile memory cells are patterned subsequently and conventional patterning is performed in parts of the integrated circuit that include logic circuits and/or static random access memory.

Moreover, due to the presence of multiple gates, nonvolatile memory cells as described above may require a relatively large area on a substrate on which an integrated circuit wherein the nonvolatile memory cells are provided is formed.

The present disclosure provides semiconductor structures and methods for the formation of semiconductor structures which may help to substantially overcome or at least reduce some or all of the above-mentioned issues.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a nonvolatile memory cell. The nonvolatile memory cell includes a first nonvolatile bit storage element and a second nonvolatile bit storage element. The first and second nonvolatile bit storage elements have a common source region provided in a semiconductor material and a common control gate structure. Each nonvolatile bit storage element includes a drain region and a channel region, a select gate structure, a floating gate structure and an erase gate structure. The drain region and the channel region are provided in the semiconductor material. The channel region has a select gate side portion and a floating gate side portion. The select gate structure is provided at the select gate side portion of the channel region and the floating gate structure is provided at the floating gate side portion of the channel region. The erase gate structure is provided above the select gate structure and adjacent the floating gate structure. The control gate structure extends above the floating gate structures of the first and second nonvolatile bit storage elements.

Another illustrative semiconductor structure disclosed herein includes a plurality of static random access memory cells and a plurality of nonvolatile memory cells. Each static random access memory cell has a bitline connection node and an inverse bitline connection node. Each nonvolatile memory cell includes a first nonvolatile bit storage element and a second nonvolatile bit storage element. The first and second nonvolatile bit storage elements have a common source region provided in a semiconductor material and a common control gate structure. Each nonvolatile bit storage element includes a drain region, a channel region, a select gate structure, a floating gate structure and an erase gate structure. The drain region and the channel region are provided in the semiconductor material. The channel region has a select gate side portion and a floating gate side portion. The select gate structure is provided in a trench in the semiconductor material at the select gate side portion of the channel region. The floating gate structure is provided at the floating gate side portion of the channel region. The erase gate structure is above the select gate structure and adjacent the floating gate structure. The control gate structure extends above the floating gate structures of the first and second nonvolatile bit storage elements. Each of the bitline connection nodes and the inverse bitline connection nodes of the plurality of static random access memory cells is associated with a respective one of the nonvolatile bit storage elements of the plurality of nonvolatile memory cells. The semiconductor structure includes a drive circuit for performing a storage operation wherein a data bit indicative of a respective voltage at each of the bitline connection nodes and inverse bitline connection nodes is stored in the one of the nonvolatile bit storage elements associated therewith and a recall operation wherein a respective voltage at each of the bitline connection nodes and inverse bitline connection nodes is set on the basis of the data bit stored in the one of the nonvolatile bit storage elements associated therewith.

An illustrative method disclosed herein includes providing a semiconductor structure. The semiconductor structure includes a substrate, a floating gate structure over the substrate, a source region, a drain region and a dielectric material over the substrate and the floating gate structure. The source region and the drain region are provided in portions of the substrate at opposite sides of the floating gate structure. Portions of the dielectric material, the floating gate structure and the substrate are removed to form a trench adjacent the drain region. A select gate structure and an erase gate structure are formed in the trench. The erase gate structure is arranged over the select gate structure. The erase gate structure is arranged adjacent the floating gate structure. Portions of the dielectric material over the floating gate structure are removed. A control gate structure is formed over the floating gate structure.

BRIEF DESCRIPTION OF THE DRAWINGS

The disclosure may be understood by reference to the following description taken in conjunction with the accompanying drawings, in which like reference numerals identify like elements, and in which.

Figure 1:
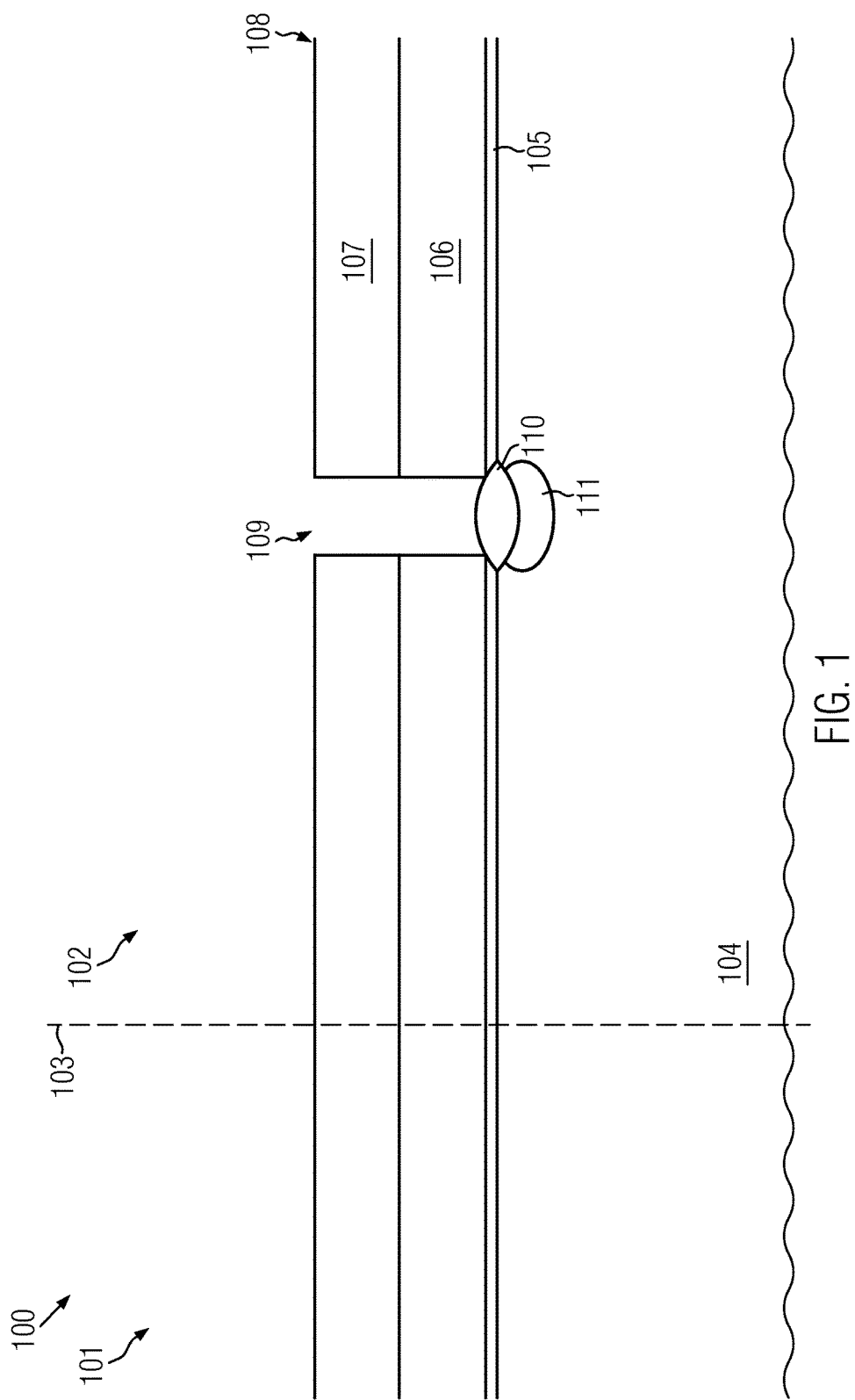
FIGS. 1-9 show schematic cross-sectional views of a semiconductor structure according to an embodiment in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, a dual bit nonvolatile memory cell wherein two bits may be stored, and which has a relatively small cell area, is provided. The nonvolatile memory cell includes a first nonvolatile bit storage element and a second nonvolatile bit storage element. Each of the nonvolatile bit storage elements can store one of the two data bits. Each of the nonvolatile bit storage elements may include a buried select gate and an erase gate, which may be stacked on top of each other. Providing stacked select and erase gates may help to reduce an area of the nonvolatile memory cell. Furthermore, the erase gate may be formed in a self-aligned manner on top of the buried select gate, wherein a single photolithography step may be performed in the formation of the select gate and the erase gate. Thus, the manufacturing of the nonvolatile memory cell may be simplified. Each of the nonvolatile bit storage elements of a nonvolatile memory cell may include a floating gate, and the nonvolatile bit storage elements may have a self-aligned shared control gate. The select gates, erase gates and control gates may be formed after the patterning of gate electrodes in portions of the semiconductor structure wherein field effect transistors of logic circuits and/or static random access memory circuits are formed.

Nonvolatile memory cells as described herein may be compatible to polysilicon silicon oxynitride gate first technology, high-k metal gate first technology and/or high-k replacement metal gate technology according to the 28-nm technology node of semiconductor manufacturing.

In embodiments disclosed herein, a first part of the manufacturing of the nonvolatile memory cells may be performed before the formation of a shallow trench isolation (STI) structure and before the formation of field effect transistors in portions of the semiconductor structure wherein logic circuits and/or static random access memory circuits are formed. In particular, processes of deposition, patterning, ion implantation and/or oxidation may be performed before the formation of the field effect transistors of the logic circuits and static random access memory circuits for providing source regions and floating gates of the nonvolatile memory cells.

After the formation of the field effect transistors of the logic circuits and/or static random access memory (SRAM) circuits, a dielectric material, which may include an interlayer dielectric, may be deposited, and a polishing process may be performed for obtaining a substantially planar surface of the dielectric material. Thereafter, a "buried device" technique may be performed for forming the select gates and erase gates of the nonvolatile memory cells, and the control gates may also be formed.

For forming the select gates and the erase gates, a trench may be etched through the dielectric material into the semiconductor material. The trenches may be filled with a metal, and the metal may be recessed for forming the select gates. On top of the select gates, another metal layer may be placed in the same trench, which may be used as the erase gate, wherein an electrically insulating capping layer may be formed for electrically insulating the select gates and the erase gates from each other. Thereafter, the dielectric material may be removed in the area between the two erase gates of each nonvolatile memory cell, and an oxide-nitride-oxide (ONO) stack and a metal may be deposited for forming the control gates of the nonvolatile memory cells.

In some embodiments, the "buried device" techniques used for the formation of the select and erase gates may have features corresponding to those of techniques used in the formation of buried wordlines of dynamic random access memory circuits. The formation of the control gates may have features similar to replacement gate patterning techniques.

In some embodiments, nonvolatile memory cells as described herein may be employed in nonvolatile static random access memory (NVSRAM) circuits along with SRAM cells. In NVSRAM circuits, data bits representing the information "0" and "1" of the two inner nodes of each SRAM memory cell may be stored in a bit storage element of the nonvolatile memory cells if the power supply of the integrated circuit is interrupted unexpectedly. After a reboot of the integrated circuit, the contents of the SRAM memory cells may be restored from the nonvolatile memory cells. In this concept, relatively fast SRAM and nonvolatile memory may be combined in one integrated circuit. Nonvolatile memory cells as disclosed herein may enable fast read operations, a robust data retention and may provide an improved endurance of the integrated circuit. NVSRAM devices as disclosed herein may be employed in robots and/or automats.

FIG. 1 shows a schematic cross-sectional view of a semiconductor structure 100 according to an embodiment in a stage of a method of manufacturing a semiconductor structure according to an embodiment. The semiconductor structure 100 includes a substrate 104. The substrate 104 may be provided in the form of a wafer formed of a semiconductor material such as, for example, silicon. In FIG. 1, reference numeral 101 denotes a field effect transistor region wherein a field effect transistor will be formed in later stages of the manufacturing process. Reference numeral 102 denotes a nonvolatile memory cell region wherein a nonvolatile memory cell will be formed. A boundary between the field effect transistor region 101 and the nonvolatile memory cell region 102 is illustrated by a dashed line 103. The field effect transistor formed in the field effect transistor region 101 may be part of a logic circuit or a volatile memory, such as, for example, a static random access memory (SRAM). In particular, the transistor formed in the field effect transistor region 101 may represent a field effect transistor provided in an SRAM cell such as, for example, a pull-up transistor, a pull-down transistor or a passgate transistor.

The nonvolatile memory cell formed in the nonvolatile memory cell region 102 and an SRAM cell including the field effect transistor formed in the field effect transistor region 101 may both be part of a nonvolatile static random access memory (NVSRAM) circuit. An example of an NVSRAM circuit will be described below with reference to FIG. 10. However, the present disclosure is not limited to embodiments wherein the nonvolatile memory cell formed in the nonvolatile memory cell region 102 is part of an NVSRAM circuit. In other embodiments, the nonvolatile memory cell may be part of a flash memory device. In such embodiments, the field effect transistor formed in the field effect transistor region 101 may represent a transistor of a controller of the flash memory device, or a transistor in a logic circuit of an embedded system.

The semiconductor structure 100 may further include a layer stack 108. The layer stack 108 may include a layer 105 of a floating gate insulation material such as, for example, silicon dioxide, from which floating gate insulation layers will be formed in later stages of the manufacturing process. Additionally, the layer stack 108 may include a layer 106 of a floating gate material such as, for example, polysilicon, from which floating gates will be formed, and a pad layer 107. In some embodiments, the pad layer 107 may include silicon nitride.

The layer 105 of floating gate insulation material, the layer 106 of floating gate material and the pad layer 107 may be formed by means of deposition techniques such as chemical vapor deposition and/or plasma enhanced chemical vapor deposition. In embodiments wherein the floating gate insulation material of the layer 105 includes silicon dioxide, substantially the entire layer 105 of floating gate insulation material and/or a portion thereof may alternatively be formed by means of an oxidation process wherein the semiconductor material of the substrate 104 is oxidized.

In some embodiments, before the formation of the layer stack 108, additional processing steps may be performed such as, for example, a formation of zero layer alignment marks on the substrate 104, which may be used for alignment purposes in photolithography processes performed in later stages of the manufacturing process. Additionally, in some embodiments, an ion implantation may be performed before the formation of the layer stack 108 for introducing dopants into the semiconductor material of the substrate 104 in the nonvolatile memory cell region 102 for doping an active region of the nonvolatile memory cell to be formed in the nonvolatile memory cell region 102.

The semiconductor structure 100 may further include an opening 109 extending through the layer stack 108. At the bottom of the opening 109, a source region 111 and an oxide region 110 over the source region 111 may be provided. The source region 111 may provide a common source region of two nonvolatile bit storage elements provided on opposite sides of the source region 111 in the nonvolatile memory cell formed in the nonvolatile memory cell region 102. The source region 111 may be doped differently than other portions of the semiconductor material of the substrate 104 in the nonvolatile memory cell region 102. For example, in some embodiments, the source region 111 may be N-doped, and other portions of the semiconductor material of the substrate 104 in the nonvolatile memory cell region 102 wherein channel regions of the nonvolatile bit storage elements of the nonvolatile memory cell will be formed, as described below, may be P-doped or substantially undoped.

The opening 109 may be formed by means of techniques of photolithography and etching. After the formation of the opening 109, an ion implantation process may be performed wherein ions of a dopant are implanted into the semiconductor material of the substrate 104 through the opening 109 for forming the source region 111. Thereafter, an oxidation process may be performed for forming the oxide region 110. In the oxidation process, the semiconductor structure 100 may be exposed to an oxidizing ambient at an elevated temperature, so that a portion of the semiconductor material of the substrate 104 exposed at the bottom of the opening 109 is oxidized. Other portions of the semiconductor material of the substrate 104 may be protected from oxidation by the layer stack 108. In some embodiments, features of the oxidation process performed for forming the oxide region 110 may correspond to those of known processes for the local oxidation of silicon (LOCOS).

At the stage of the manufacturing process illustrated in FIG. 1, the semiconductor structure 100 need not include any field effect transistors. Thus, an adverse influence of the ion implantation process for forming the source region 111 and the oxidation process for forming the oxide region 110 on field effect transistors including a high-k gate insulation layer and a gate including a metal may be avoided.

Figure 2:
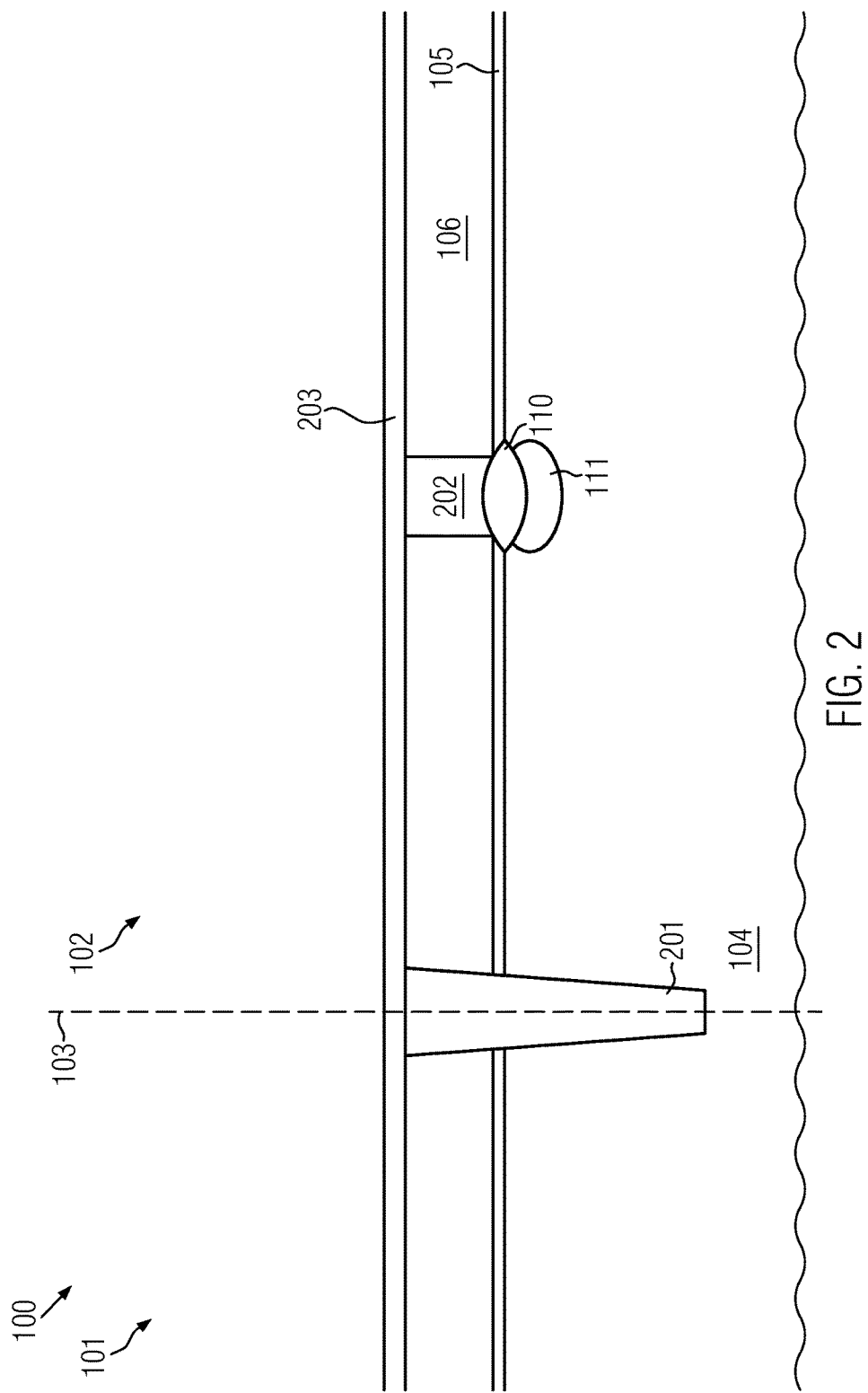

FIG. 2 shows a schematic cross-sectional view of the semiconductor structure 100 in a later stage of the manufacturing process. After the formation of the source region 111 and the oxide region 110, a trench isolation structure 201 may be formed. The trench isolation structure 201 may provide an electrical insulation between the nonvolatile memory cell region 102 and the field effect transistor region 101. Other portions of the trench isolation structure 201 (not shown) may provide an electrical insulation between the nonvolatile memory cell formed in the nonvolatile memory cell region 102 and other nonvolatile memory cells formed in the semiconductor structure 100 (not shown).

For forming the trench isolation structure 201, techniques of photolithography and etching may be employed for forming a trench extending through the layer stack 108 into the substrate 104. Thereafter, techniques of oxidation and deposition may be employed for filling the trench with an electrically insulating material such as silicon dioxide. When the trench is filled with the electrically insulating material, the opening 109 may also be filled with the electrically insulating material, such that an isolation region 202 is formed in the opening 109. The isolation region 202 may provide electrical insulation between floating gates of the nonvolatile memory cell formed in the nonvolatile memory cell region 102.

After filling the trench and the opening 109 with the electrically insulating material, a polishing process, for example, a chemical mechanical polishing process, may be performed for removing portions of the electrically insulating material outside the trench and the opening 109. Thereafter, the pad layer 107 may be removed by means of a pad nitride strip process. The pad nitride strip process may be an etch process adapted for selectively removing silicon nitride relative to silicon dioxide and polysilicon. Thereafter, a protection layer 203 may be formed, for example, by means of a chemical vapor deposition process or a plasma enhanced chemical vapor deposition process. The protection layer 203 may be formed of a different material than the pad layer 107. For example, in embodiments wherein the pad layer 107 includes silicon nitride, the protection layer 203 may be formed of silicon dioxide. The protection layer 203 may protect the layer 106 of floating gate material from adverse influences of manufacturing processes performed after the formation of the protection layer 203.

Figure 3:
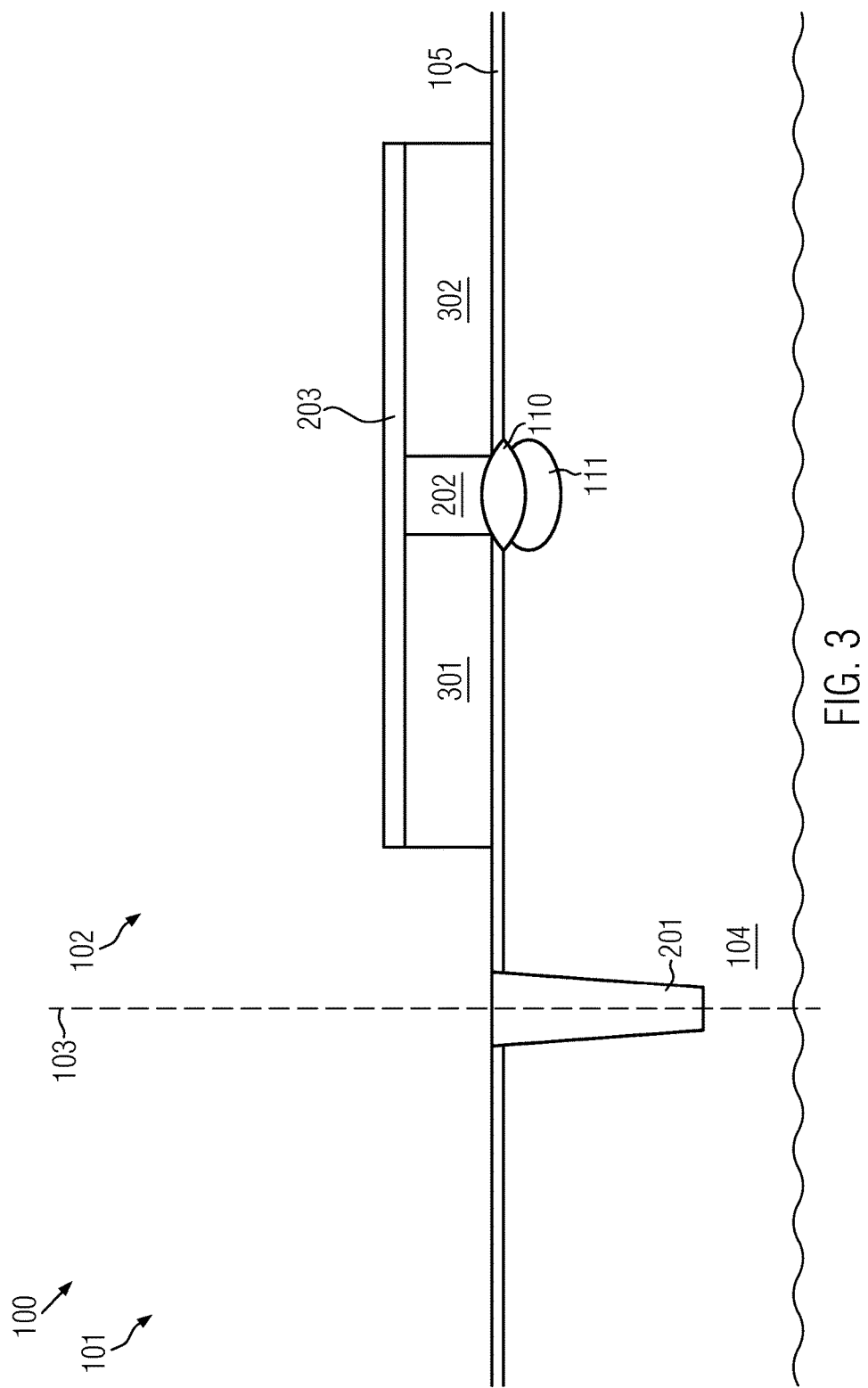

FIG. 3 shows a schematic cross-sectional view of the semiconductor structure 100 in a later stage of the manufacturing process. After the formation of the protection layer 203, the layer 106 of floating gate material and the protection layer 203 may be patterned by means of processes of photolithography and etching. In doing so, portions of the layer 106 of floating gate material and the protection layer 203 over the field effect transistor region 101 may be removed. Additionally, portions of the layer 106 of floating gate material and the protection layer 203 in parts of the nonvolatile memory cell region 102 wherein drain regions of the nonvolatile memory cell will be formed in later stages of the manufacturing process may be removed. Portions of the layer 106 of floating gate material remaining in the semiconductor structure 100 may form a floating gate 301 and a floating gate 302 that are provided on opposite sides of the source region 111. In some embodiments, portions of the layer 105 of floating gate insulation material over the field effect transistor region 101 and/or parts of the nonvolatile memory cell region 102 wherein drain regions of the nonvolatile memory cell will be formed may remain in the semiconductor structure 100, and may be removed in later stages of the manufacturing process.

In some embodiments, after the patterning of the layer 106 of floating gate material and the protection layer 203, trench isolation structures may be formed in non-memory areas of the semiconductor structure 100, for example, in parts of the semiconductor structure 100 wherein logic circuits are formed. This may help to provide features of trench isolation structures in non-memory areas that are different from features of the trench isolation structure 201. For example, trench isolation structures in non-memory areas may extend to a different depth, for example, a smaller depth, into the semiconductor material of the substrate 104 than the trench isolation structure 201.

Figure 4:
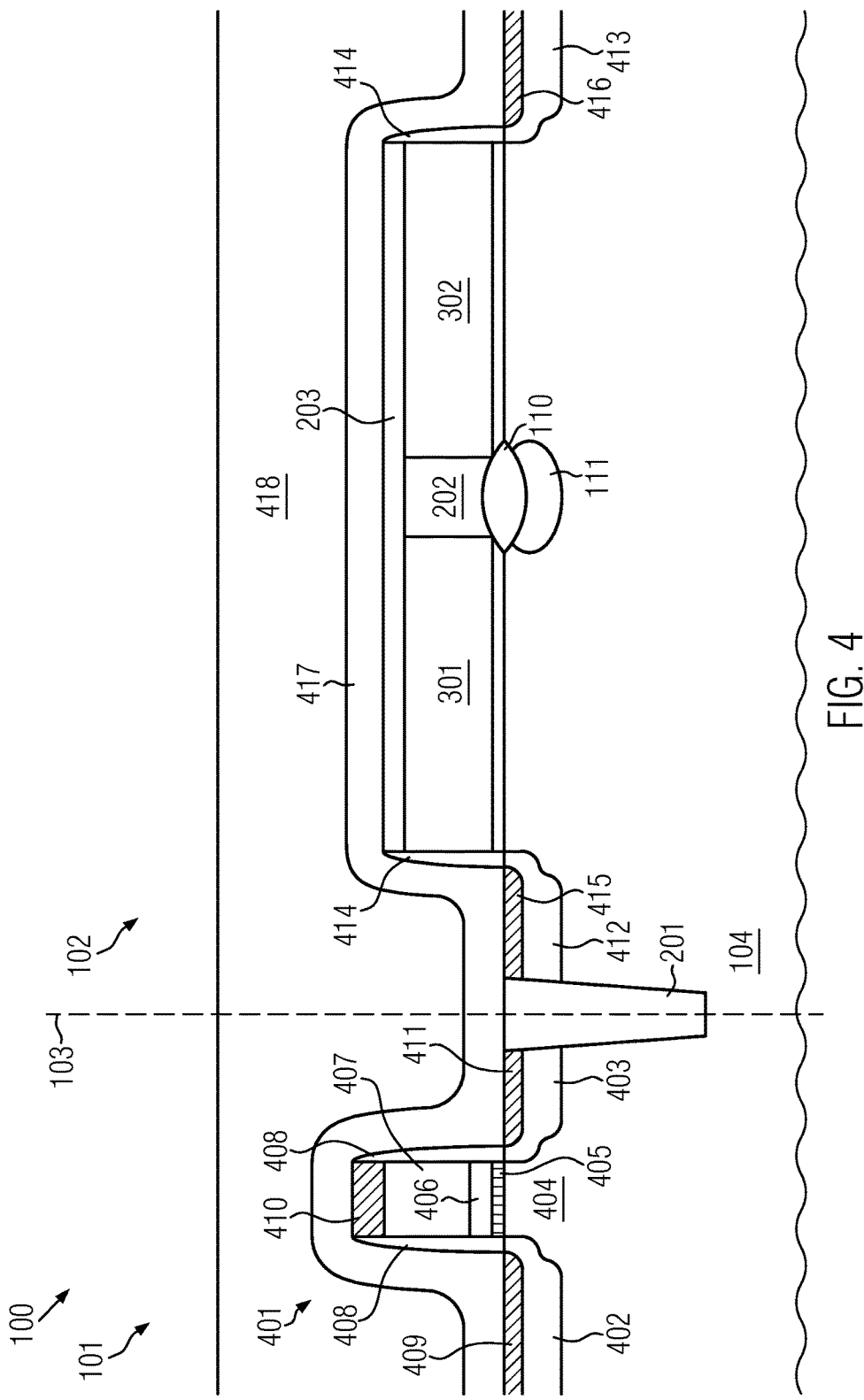

FIG. 4 shows a schematic cross-sectional view of the semiconductor structure 100 in a later stage of the manufacturing process. A field effect transistor 401 may be formed in the field effect transistor region 101. The field effect transistor 401 may include a source region 402, a drain region 403 and a channel region 404 that is arranged between the source region 402 and the drain region 403 and is doped differently than the source region 402 and the drain region 403. Over the channel region 404, a gate 407 that is separated from the channel region 404 by a gate insulation layer 405 may be provided. The gate 407 and the gate insulation layer 405 provide a gate structure of the field effect transistor 401. In some embodiments, the gate insulation layer 405 may include a high-k material having a greater dielectric constant than silicon dioxide, for example, hafnium dioxide, zirconium dioxide, hafnium silicon oxynitride and/or zirconium silicon oxynitride. In such embodiments, the gate 407 may include a metal layer 406 provided on the gate insulation layer 405. A material of the metal layer 406 may be selected in accordance with the type of the field effect transistor 401 (N-channel or P-channel) for providing a suitable work function of the gate 407. Portions of the gate 407 above the metal layer 406 may include polysilicon. Adjacent the gate 407, a sidewall spacer 408 may be provided. In the source region 402, the drain region 403 and/or the polysilicon portion of the gate 407, silicide regions 409, 410, 411 may be provided.

The present disclosure is not limited to embodiment wherein the gate 407 includes the metal layer 406. In other embodiments, the gate insulation layer 405 may include silicon oxynitride, and the metal layer 406 in the gate 407 may be omitted.

On a side of the floating gate 301 opposite the source region 111, a drain region 412 may be formed. Similarly, a drain region 413 may be formed on a side of the floating gate 302 opposite the source region 111. The drain regions 412, 413 may be doped, wherein a same type of dopant is provided in the drain regions 412, 413 and the source region 111. In particular, in some embodiments, both the source region 111 and the drain regions 412, 413 may be N-doped. Similar to the source region 402 and the drain region 403 of the field effect transistor 401, the drain regions 412, 413 formed in the nonvolatile memory cell region 102 may include silicide regions 415, 416.

Adjacent the floating gate 301, 302, a sidewall spacer 414 may be provided. Moreover, a liner layer 417 and an interlayer dielectric 418 may be provided over the semiconductor structure 100. The liner layer 417 and the interlayer dielectric 418 provide a dielectric material over the field effect transistor 401, over the drain regions 412, 413 and over the floating gates 301, 302. In some embodiments, the liner layer 417 may include silicon nitride and the interlayer dielectric 418 may include silicon dioxide.

For forming the field effect transistor 401, known techniques for the formation of field effect transistors may be used. In some embodiments, a gate first approach may be employed, wherein a gate stack including layers of the materials of the gate insulation layer 405, the optional metal layer 406 and the upper part of the gate 407 is deposited over the semiconductor structure 100. Thereafter, the gate stack may be patterned by means of processes of photolithography and etching. Then, the sidewall spacers 408, 414 may be formed by means of techniques of isotropic deposition and anisotropic etching. The source region 402 and the drain region 403 of the field effect transistor 401, as well as the source regions 412, 413 in the nonvolatile memory cell region 102 may be formed by means of ion implantation processes, wherein an ion implantation may be performed both before the formation of the sidewall spacers 408, 414 and after the formation of the sidewall spacers 408, 414 for obtaining a desired dopant profile, in particular adjacent the channel region 404 of the field effect transistor 401.

In embodiments wherein the source region 402 and the drain region 403 of the field effect transistor 401, on the one hand, and the drain regions 412, 413 formed in the nonvolatile memory region 102, on the other hand, are doped with a same type of dopant, the source region 402 and the drain region 403 of the field effect transistor 401 and the drain regions 412, 413 formed in the nonvolatile memory region 102 may be formed by means of one or more common ion implantation processes. Alternatively, separate ion implantation processes may be performed for forming the drain regions 412, 413 in the nonvolatile memory cell region 102 and the source 402 and drain 403 regions of the field effect transistor 401.

The silicide regions 409, 410, 411, 415, 416 may be formed by depositing a layer of a metal, for example a nickel layer, over the semiconductor structure 100 and performing one or more annealing processes for initiating a chemical reaction between the metal of the metal layer and the semiconductor material of the substrate 104 exposed in the source and drain regions 402, 403, 412, 413 and the polysilicon of the gate 407. Thereafter, unreacted metal may be removed by means of an etch process.

After the formation of the silicide regions 409, 410, 411, 415, 416, the liner layer 417 and the interlayer dielectric 418 may be deposited over the semiconductor structure. The liner layer 417 may be formed by means of a plasma enhanced chemical vapor deposition process adapted for the deposition of silicon nitride. In some embodiments, the plasma enhanced chemical vapor deposition process may be adapted such that substantially unstressed (neutral) silicon nitride is obtained. The interlayer dielectric 418 may be formed by means of processes of chemical vapor deposition or plasma enhanced chemical vapor deposition adapted for the deposition of silicon dioxide.

After the deposition of the interlayer dielectric 418, a polishing process, for example a chemical mechanical polishing process, may be performed for obtaining a substantially planar surface of the interlayer dielectric 418.

The present disclosure is not limited to embodiments wherein a gate first approach is used for forming the field effect transistor 401. In other embodiments, a replacement gate approach may be employed, wherein a dummy gate insulation layer and a dummy gate are formed, and are replaced with the final gate insulation layer 405 and the final gate 407 of the field effect transistor 401 after the formation of the liner layer 417 and the interlayer dielectric 418. In such embodiments, the dielectric material provided by the liner layer 417 and the interlayer dielectric 418 may have a smaller thickness than shown in FIG. 4, so that the dummy gate electrode of the field effect transistor 401 may be exposed in the polishing of the interlayer dielectric 418 for performing the gate replacement process.

In some embodiments wherein the field effect transistor 401 is a P-channel field effect transistor, a layer of silicon germanium (not shown) may be provided in the field effect transistor region 101 for obtaining a compressive stress in the channel region 404 of the field effect transistor 401. A compressively stressed channel region 404 may help to provide a greater mobility of holes in the channel region 404.

In other embodiments wherein the field effect transistor 401 is a P-channel transistor, the gate insulation layer 405 includes silicon oxynitride and the gate 407 includes polysilicon provided directly on the gate insulation layer 405, raised source and drain regions (not shown) may be formed adjacent the gate 407.

Further techniques employed in the formation of the field effect transistor 401 may correspond to known techniques conventionally employed in the formation of field effect transistors.

Figure 5:
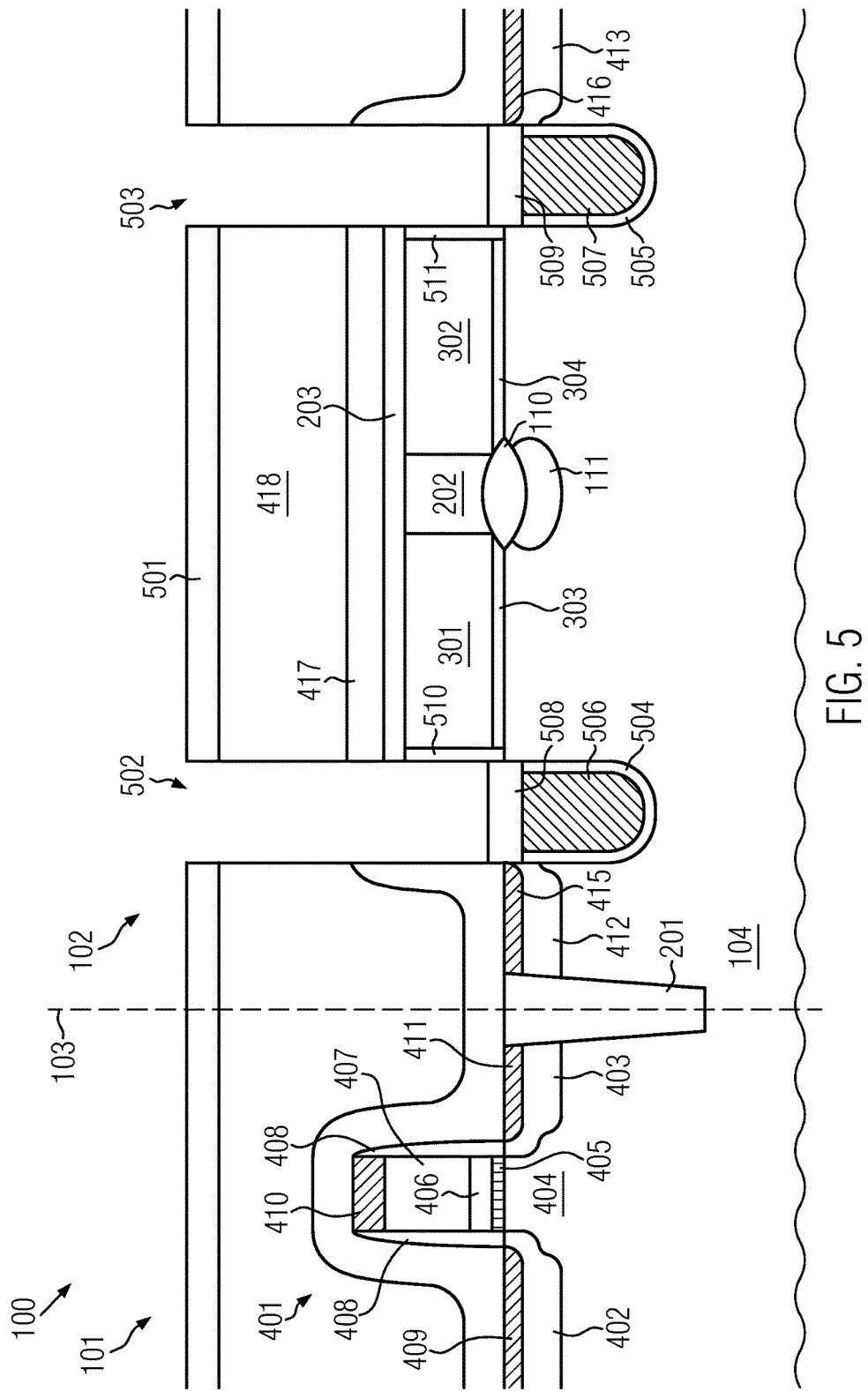

FIG. 5 shows a schematic cross-sectional view of the semiconductor structure 100 in a later stage of the manufacturing process. After the planarization of the interlayer dielectric 418, a polish stop layer 501 may be deposited over the semiconductor structure. The polish stop layer 501 may include silicon nitride and may be deposited by means of processes of chemical vapor deposition and/or plasma enhanced chemical vapor deposition.

Thereafter, a trench 502 may be formed adjacent the drain region 412, and a trench 503 may be formed adjacent the drain region 413. The trenches 502, 503 may be formed by means of processes of photolithography and etching. A photomask covering portions of the semiconductor structure 100 except portions at the locations of the trenches 502, 503 may be formed by means of photolithography. Thereafter, a multistep etch process may be performed. The multistep etch process may include a nitride etch process for removing portions of the polish stop layer 501, an oxide etch process for removing portions of the interlayer dielectric 418, another nitride etch process for removing portions of the liner layer 407, and an unselective etch process. The unselective etch process may be adapted for removing at least silicon and silicon dioxide, and may be employed for removing portions of the protection layer 203, the floating gates 301, 302, the floating gate insulation layers 303, 304 and the substrate 104. The multistep etch process may be a reactive ion etch process, wherein parameters of the reactive ion etch process, such as a composition of the etch gas, gas flows, pressure, temperature, radio frequency power and/or bias power, may be varied between the individual steps of the multistep etch process for obtaining the desired etch selectivity. In some embodiments, the multistep etch process may also remove the sidewall spacer 414 at the floating gates 301, 302. In other embodiments, the sidewall spacer 414, or at least portions thereof, may remain in the semiconductor structure 100. For simplicity, in FIGS. 5-9, the sidewall spacer 414 has been omitted.

In some embodiments, features of the multistep etch process employed for the formation of the trenches 502, 503 may correspond to features of etch processes employed in the formation of buried word lines in standard dynamic random access memory (DRAM) cells.

The trenches 502, 503 may extend through the dielectric material provided by the liner layer 417 and the interlayer dielectric 418 into the semiconductor material of the substrate 104 in portions of the substrate 104 adjacent the drain regions 412, 413. In addition to the materials of the liner layer 417, the interlayer dielectric 418, and the substrate 104, after the formation of the trenches 502, 503, materials of the protection layer 203, the floating gates 301, 302 and the floating gate insulation layers 303, 304 may be exposed at walls of the trenches 502, 503.

After the formation of the trenches 502, 503, a select gate insulation layer 504 may be formed at walls of the trench 502 in a lower part of the trench 502 that extends into the semiconductor material of the substrate 104. Similarly, a select gate oxide insulation layer 505 may be formed at walls of the trench 503 in a lower part of the trench 503 extending into the semiconductor material of the substrate 104.

The select gate insulation layers 504, 505 may be formed in an oxidation process wherein the semiconductor structure 100 is exposed to an oxidizing ambient. The formation of the select gate insulation layers 504, 505 and the tunnel layers 510, 511 may be performed at a relatively low temperature in a range from about 200-450° C. in order to avoid adverse influences on the field effect transistor 401 such as, for example, a diffusion of dopants and/or a degradation of a silicide such as nickel silicide in the silicide regions 409, 410, 411.

After the formation of the select gate insulation layers 504, 505, the trenches 502, 503 may be filled with an electrically conductive metal. The electrically conductive metal may include tungsten and it may be deposited by means of a physical vapor deposition process, chemical vapor deposition process or plasma-enhanced chemical vapor deposition process adapted for the deposition of tungsten. In some embodiments, before the deposition of tungsten, a titanium nitride layer may be deposited at the walls of the trenches 502, 503. This may be done by means of a chemical vapor deposition process, plasma enhanced chemical vapor deposition process and/or atomic layer deposition process.

After filling the trenches 502, 503 with the electrically conductive metal, a polishing process, for example a chemical mechanical polishing process may be performed for removing portions of the electrically conductive metal outside the trenches 502, 503. In doing so, the polish stop layer 501 may protect the interlayer dielectric 418 from being affected by the polishing process. In other embodiments, the polishing process may be omitted.

Thereafter, portions of the electrically conductive metal in upper parts of the trenches 502, 503 may be removed. This may be done by means of an etch process, for example, a reactive ion etch process. Portions of the electrically conductive metal in the lower parts of the trenches 502, 503 may remain in the semiconductor structure 100, and may form select gates 506, 507.

Thereafter, an electrically insulating capping layer 508 may be formed over the select gate 506 in the trench 502, and a capping layer 509 may be formed over the select gate 507 in the trench 503. The capping layers 508, 509 may include silicon dioxide. For forming the capping layers, a layer of a material of the capping layers 508, 509, for example a silicon dioxide layer, may be deposited over the semiconductor structure. Then, in some embodiments, a polishing process, for example a chemical mechanical polishing process, may be performed for removing portions of the layer of the material of the capping layer outside the trenches 502, 503. Thereafter, an etch process, for example a reactive ion etch process, may be performed for removing a part of the material of the capping layers 508, 509 in the trenches 502, 503, wherein a rest of the material of the capping layers 508, 509 remaining in the trenches 502, 503 provides the capping layers 508, 509.

The present disclosure is not limited to embodiments wherein the material of the capping layers 508, 509 is polished. In other embodiments, the polishing process may be omitted, and the removal of the portions of the material of the capping layers 508, 509 outside the trenches 502, 503 may be performed by the same etch process as the removal of the part of the material of the capping layers 508, 509 in the trenches 502, 503.

In the oxidation process performed for forming the select gate insulation layers 504, 505, silicon dioxide may also be formed at sidewalls of the floating gates 301, 302 that are exposed in the upper parts of the trenches. After the removal of the part of the material of the capping layers 508, 509 in the trenches 502, 503 described above, a cleaning process may be performed for removing the silicon dioxide from the sidewalls of the floating gates 301, 302, so that the material of the floating gates 301, 302 is exposed in the upper parts of the trenches 502, 503.

Then, an oxidation process, which may have features corresponding to those of the oxidation process employed for the formation of the select gate insulation layers 504, 505 may be performed for forming a tunnel layer 510 at a sidewall of the floating gate 301 in the upper part of the trench 502. Similarly, a tunnel layer 511 may be formed at a sidewall of the floating gate 302 in the upper part of the trench 503.

Figure 6:
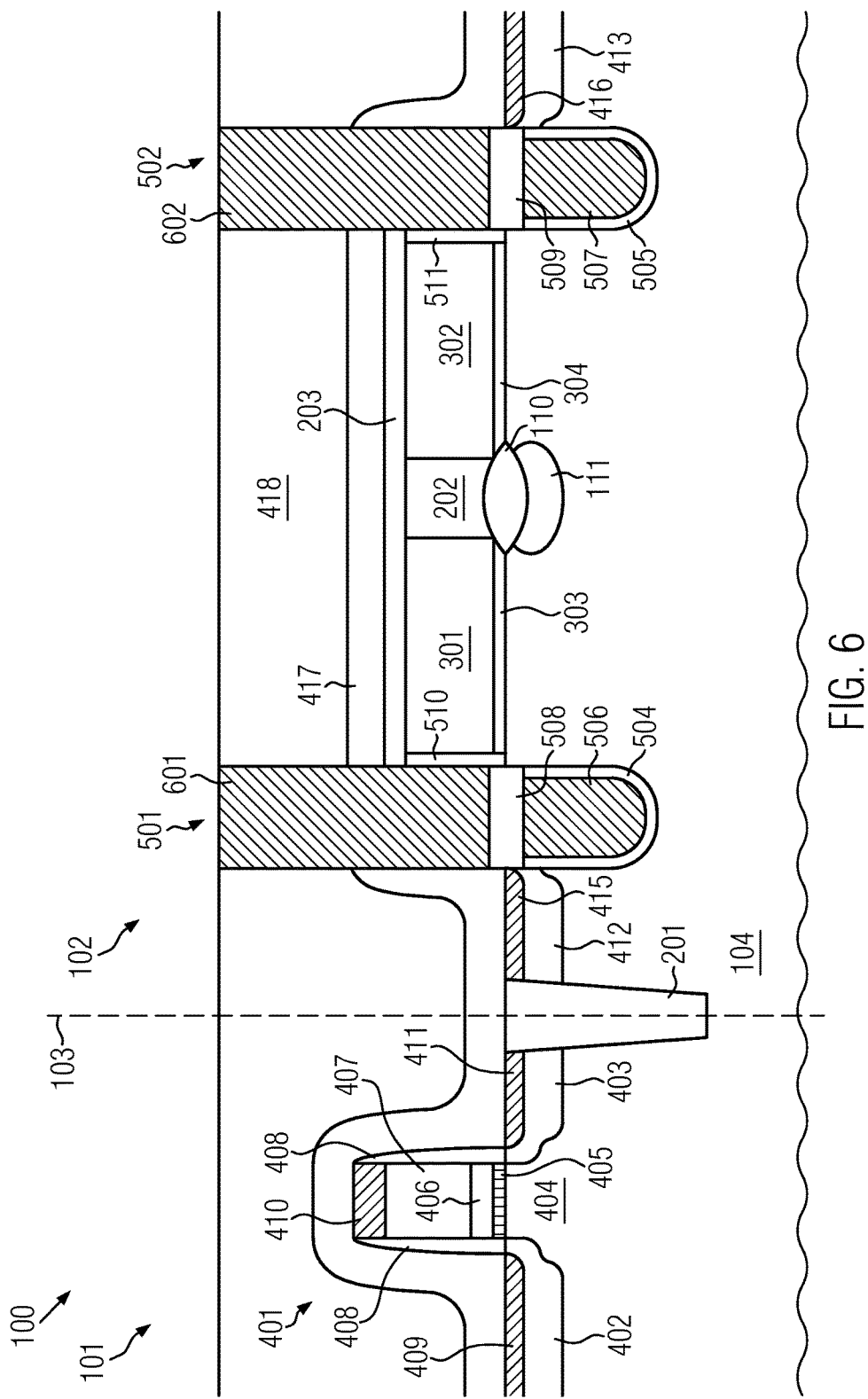

FIG. 6 shows a schematic cross-sectional view of the semiconductor structure 100 in a later stage of the manufacturing process. After the formation of the capping layers 508, 509, the upper parts of the trenches 501, 502 may be filled with an electrically conductive metal. Similar to the electrically conductive metal used for forming the select gates 506, 507, the electrically conductive metal used for filling the upper parts of the trenches 501, 502 may include tungsten, and corresponding techniques may be used for the deposition thereof.

Thereafter, a polishing process, for example a chemical mechanical polishing process, may be performed for removing portions of the electrically conductive metal outside the trenches 501, 502, and the polish stop layer 501 may be removed by means of an etch process, for example, a nitride strip process. Alternatively, the nitride strip process may be omitted and the polish stop layer 501 may remain in the semiconductor structure 100.

The electrically conductive metal in the upper part of the trench 501 may form an erase gate 601, and the electrically conductive metal in the upper part of the trench 502 may form an erase gate 602.

Thicknesses of the capping layers 508, 509 may be adapted such that an interface between the erase gate 601 and the capping layer 508 as well as an interface between the erase gate 602 and the capping layer 509 are above a level of the semiconductor material of the substrate 104 and the silicide in the silicide regions 415, 416. This may help to avoid electrical shorts between the erase gates 601, 602 and the substrate 104. In some embodiments, an overlap between the erase gate 601 and the floating gate 301 and an overlap between the erase gate 602 and the floating gate 302 may be relatively small, for example, about one third of a height of the floating gates 301, 302. In other embodiments, a greater overlap may be provided.

The select gate 506 may be electrically insulated from the erase gate 601 by the capping layer 508, and the erase gate 601 may be electrically insulated from the floating gate 301 by the tunnel layer 510. Similarly, the select gate 507 may be electrically insulated from the erase gate 602 by the capping layer 509, and the erase gate 602 may be electrically insulated from the floating gate 302 by the tunnel layer 511. Electrical insulation between the select gates 506, 507 and the semiconductor material of the substrate 104 may be provided by the select gate insulation layers 504, 505.

Figure 7:
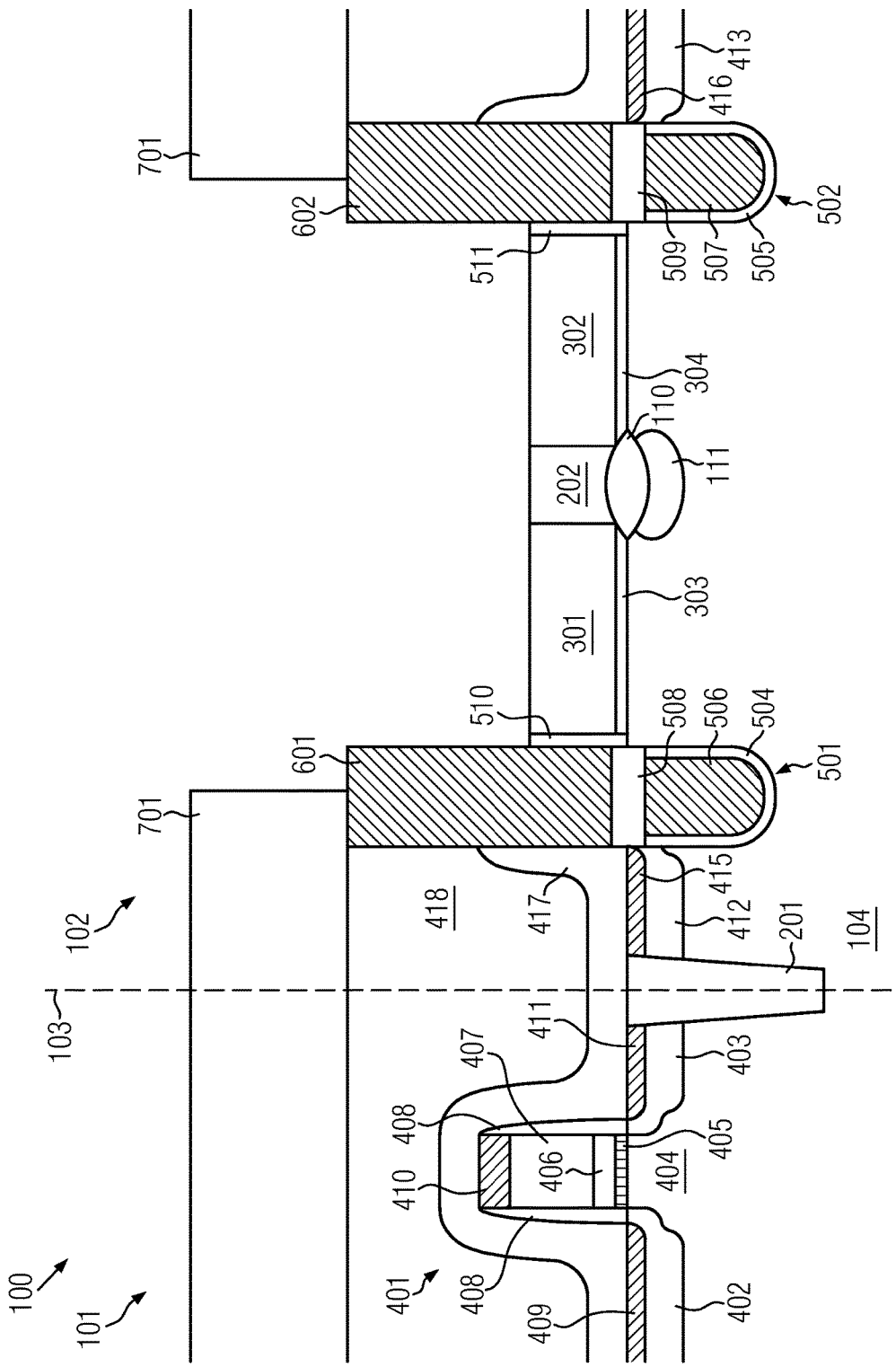

FIG. 7 shows a schematic cross-sectional view of the semiconductor structure 100 in a later stage of the manufacturing process. After the formation of the erase gates 601, 602, a mask 701 may be formed over the semiconductor structure 100. In some embodiments, the mask 701 may be a photoresist mask, and it may be formed by means of a photolithography process. In other embodiments, the mask 701 may be a hard mask, and it may be formed by patterning a layer of a hard mask material such as, for example, silicon nitride by means of processes of photolithography and etching. The mask 701 may cover the field effect transistor region 101 and portions of the nonvolatile memory cell region 102 with the exception of portions between the erase gates 601, 602, and it may cover at least parts of the erase gates 601, 602. In some embodiments, a partial overlap between the mask 701 and the erase gates 601, 602 may be provided, wherein parts of the erase gates 601, 602 are not covered by the mask 701, as shown in FIG. 7.

After the formation of the mask, one or more etch processes adapted for removing materials of the interlayer dielectric 418, the liner layer 417 and the protection layer 203 may be performed. The etch processes may be adapted such that the materials of the interlayer dielectric 418, the liner layer 417 and the protection layer 203 are selectively removed relative to the material of the erase gates 601, 602, so that the erase gates 601, 602 are substantially not affected by the one or more etch processes. By using selective etch processes, and providing only a partial overlap between the mask 701 and the erase gates 602, 602, a substantially self-aligned removal of portions of the dielectric material provided by the protection layer 203, the liner layer 417 and the interlayer dielectric 418 over the floating gates 301, 302 may be obtained. After the one or more etch processes, the floating gates 301, 302 may be exposed at the surface of the semiconductor structure 100.

Figure 8:
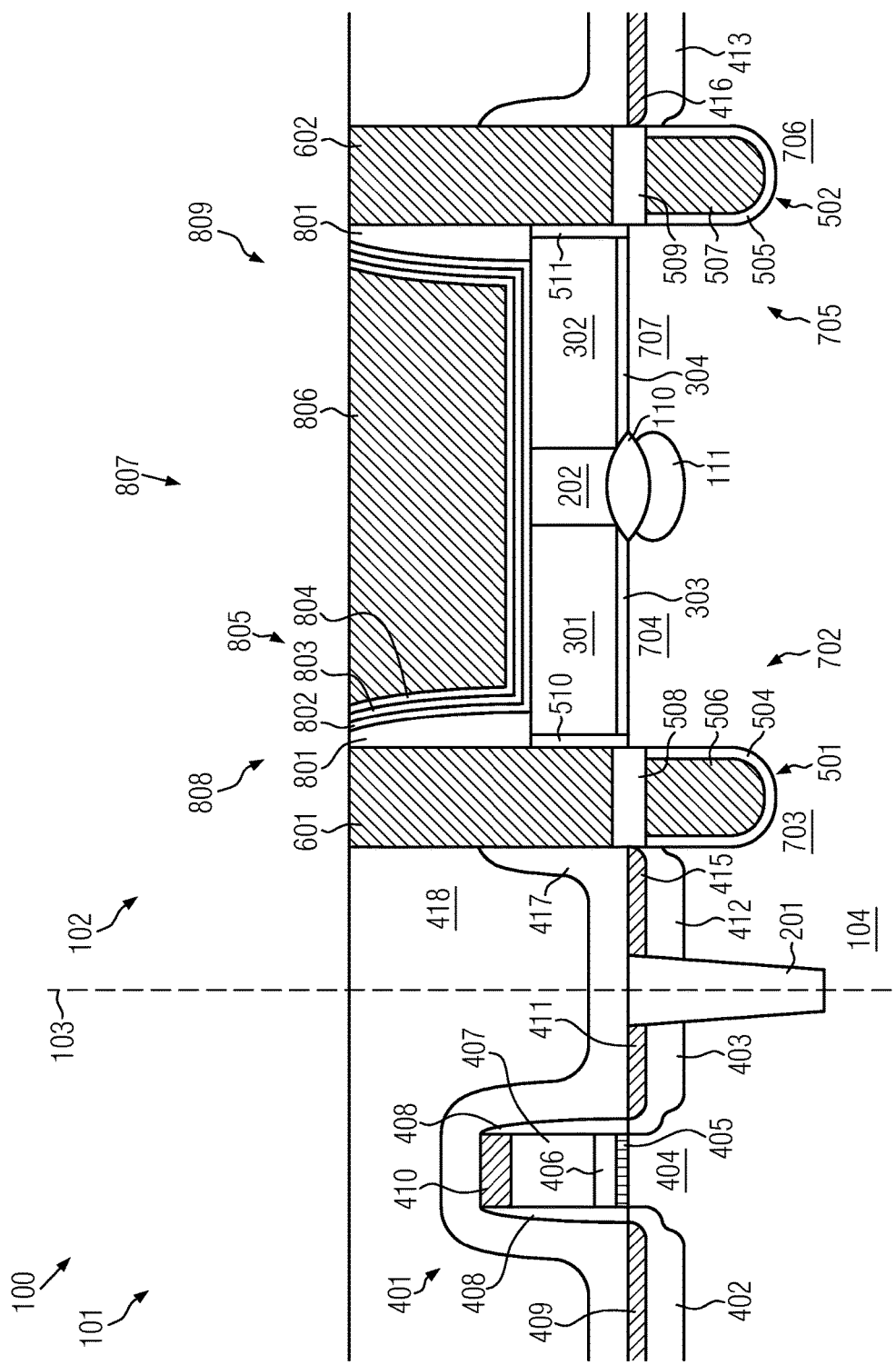

FIG. 8 shows a schematic cross-sectional view of the semiconductor structure 100 in a later stage of the manufacturing process. After the removal of the portions of the interlayer dielectric 418, the liner layer 417 and the protection layer 203 over the floating gates 301, 302, the mask 701 may be removed. In embodiments wherein the mask 701 is a photoresist mask, this may be done by means of a resist strip process. In embodiments wherein the mask 701 is a hard mask, an etch process adapted to selectively remove the material of the mask 701 may be employed.

Thereafter, a sidewall spacer 801 may be formed at sidewalls of the erase gates 601, 602. The sidewall spacer 801 may include silicon dioxide. For forming the sidewall spacer 801, a layer of a sidewall spacer material, such as, for example, a silicon dioxide layer, may be substantially isotropically deposited over the semiconductor structure 100. Thereafter, an anisotropic etch process may be performed for removing portions of the layer of sidewall spacer material on substantially horizontal portions of the semiconductor structure 100. Due to the anisotropy of the etch process, portions of the layer of sidewall spacer material at sidewalls of the erase gates 601, 602 may remain in the semiconductor structure 100 and form the sidewall spacer 801.

Thereafter, a control gate insulation layer 805 may be formed. The control gate insulation layer 805 may include a sublayer 802 of silicon dioxide, a sublayer 803 of silicon nitride and a sublayer 804 of silicon dioxide, wherein the silicon nitride sublayer 803 is arranged between the silicon dioxide sublayers 802, 804. Thus, the control gate insulation layer 805 may have an oxide-nitride-oxide (ONO) configuration. For forming the control gate insulation layer 805, deposition processes such as chemical vapor deposition, plasma enhanced chemical vapor deposition and/or atomic layer deposition may be employed.

Thereafter, a layer of an electrically conductive metal, for example, a tungsten layer, may be deposited over the semiconductor structure 100. Similar to the deposition of the tungsten layers employed in the formation of the select gates 506, 507 and the erase gates 601, 602, this may be done by means of physical vapor deposition, chemical vapor deposition and/or plasma enhanced chemical vapor deposition. Then, a polishing process, for example a chemical mechanical polishing process, may be performed for removing portions of the electrically conductive metal outside the recess in the semiconductor structure 100 that was formed over the floating gates 301, 302 by removing the protection layer 203, the liner layer 417 and the interlayer dielectric 418. Additionally, the polishing process may remove portions of the control gate insulation layer 805 outside the recess.

After the formation of the control gate insulation layer 805 and the control gate 806, the semiconductor structure 100 includes a nonvolatile memory cell 807 that is provided in the nonvolatile memory cell region 102 of the semiconductor structure 100. The nonvolatile memory cell 807 includes a nonvolatile bit storage element 808 and a nonvolatile bit storage element 809. The nonvolatile bit storage element 808 includes, in particular, the drain region 412, a select gate structure including the select gate 506, the select gate insulation layer 504 and the capping layer 508, an erase gate structure including the erase gate 601 and the tunnel layer 510, a floating gate structure including the floating gate 301 and the floating gate insulation layer 303 and a channel region 702 that is arranged between the drain region 412 and the source region 111. The channel region 702 includes a select gate side portion 703 that is arranged at the select gate 506 and a floating gate side portion 704 that is arranged at the floating gate 301. In particular, the floating gate side portion 704 of the channel region 702 may be arranged below the floating gate insulation layer 303 and the floating gate 301. The floating gate side portion 704 of the channel region 702 may be directly adjacent the source region 111.

The select gate side portion 703 of the channel region 702 may be arranged lateral to and below the select gate structure of the nonvolatile bit storage element 808 provided by the select gate insulation layer 504 and the select gate 506, and may extend from the drain region 412 to the floating gate side portion 704 of the channel region 702, wherein the select gate side portion 703 and the floating gate side portion 704 may be contiguous with each other. In some embodiments, the select gate side portion 703 of the channel region 702 may have a generally U-shape.

The nonvolatile bit storage element 809 includes a floating gate structure provided by the floating gate insulation layer 304 and the floating gate 302, a select gate structure provided by the select gate 507, the select gate insulation layer 505 and the capping layer 509, an erase gate structure provided by the erase gate 602 and the tunnel layer 511, and the drain region 413. Additionally, the nonvolatile bit storage element 809 includes a channel region 705 having a select gate side portion 706 at the select gate structure and a floating gate side portion 707 at the floating gate structure. The source region 111 may be a common source region of the nonvolatile bit storage elements 808, 809 and the control gate insulation layer 805 and the control gate 806 may provide a common control gate structure of the nonvolatile bit storage elements 808, 809.

Figure 9:
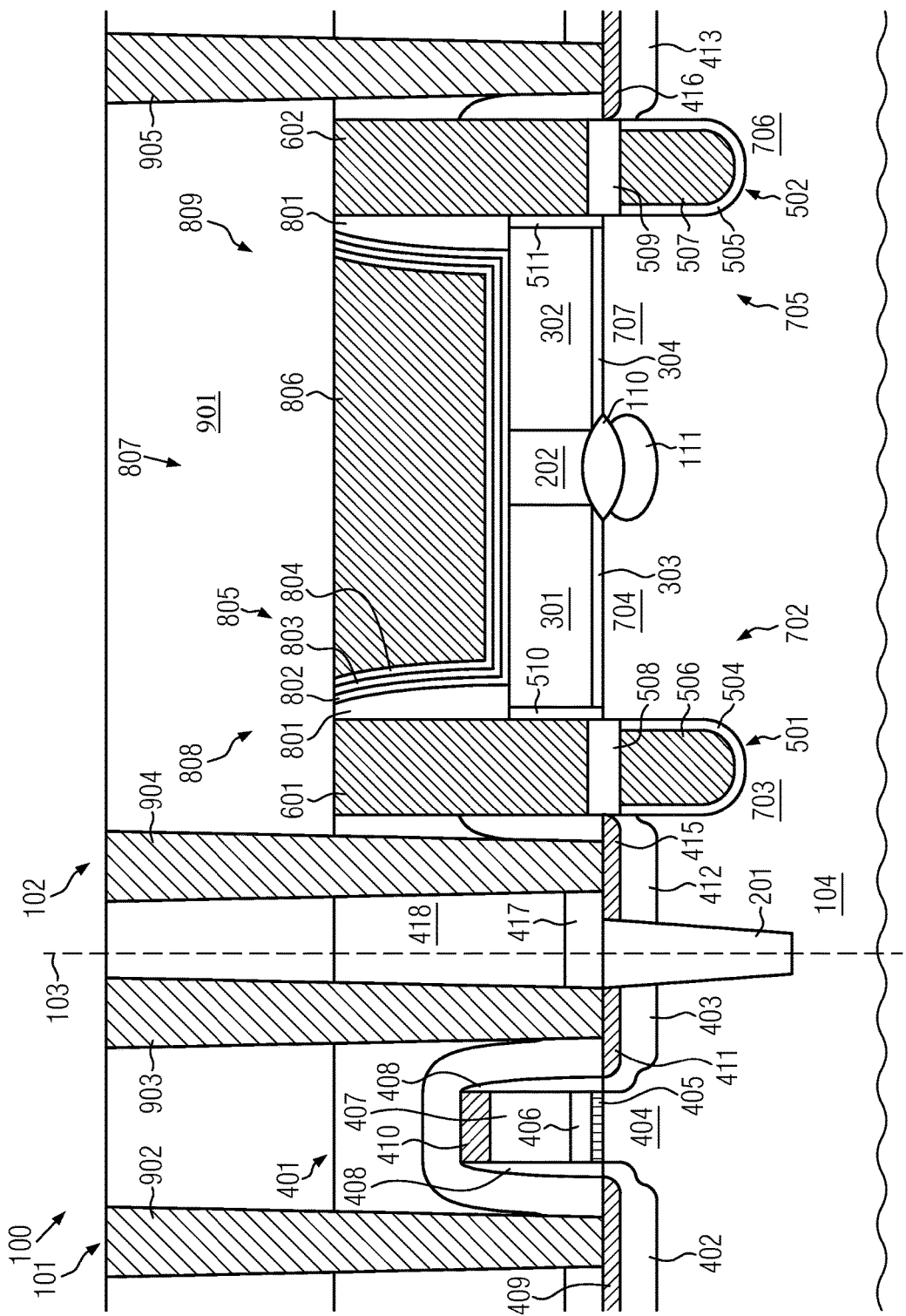

FIG. 9 shows a schematic cross-sectional view of the semiconductor structure 100 in a later stage of the manufacturing process. After the formation of the control gate insulation layer 805 and the control gate 806, an interlayer dielectric 901 may be deposited over the semiconductor structure 100. The interlayer dielectric 901 may include silicon dioxide and may be formed by means of techniques of chemical vapor deposition and/or plasma enhanced chemical vapor deposition.

Thereafter, contacts 902, 903, 904, 905 providing electrical connections to the field effect transistor 401 and the nonvolatile memory cell 807 may be formed. The contacts 902 to 905 may be provided in the form of contact holes extending through the interlayer dielectrics 418, 901 and the liner layer 417 and being filled with an electrically conductive metal such as, for example, tungsten. The contacts 902, 903 may provide electrical connections to the source region 402 and the drain region 403, respectively, of the field effect transistor 401. The contacts 904, 905 may provide electrical connections to the drain region 412 of the nonvolatile bit storage element 808 and the drain region 413 of the nonvolatile bit storage element 809, respectively. Additional contacts (not shown) landing on the electrically conductive metal of the select gates 506, 507, the erase gates 601, 602 and/or the control gates may also be provided in some embodiments wherein the nonvolatile memory cell 807 is provided in a flash memory. Additionally, contacts providing electrical connections to the erase gates 601, 602, the select gates 506, 507 and the control gate 806 may be formed. These contacts may be provided at locations outside the plane of drawing of FIG. 9 and, therefore, are not shown in the cross-sectional view of FIG. 9.

In embodiments wherein the nonvolatile memory cell 807 is provided in a flash memory, the contacts 904, 905 may provide an electrical connection between the nonvolatile memory cell 807 and a bitline (not shown) provided above the contacts 904, 905 and extending in a bitline direction (horizontal in the plane of drawing of FIG. 9). The select gates 506, 507, the erase gates 601, 602, the control gate 806 and the source region 111 may extend in a word line direction (perpendicular to the plane of drawing of FIG. 9), and may be contiguous with corresponding features of nonvolatile memory cells that are adjacent the nonvolatile memory cell 807 in the word line direction.

Figure 10:
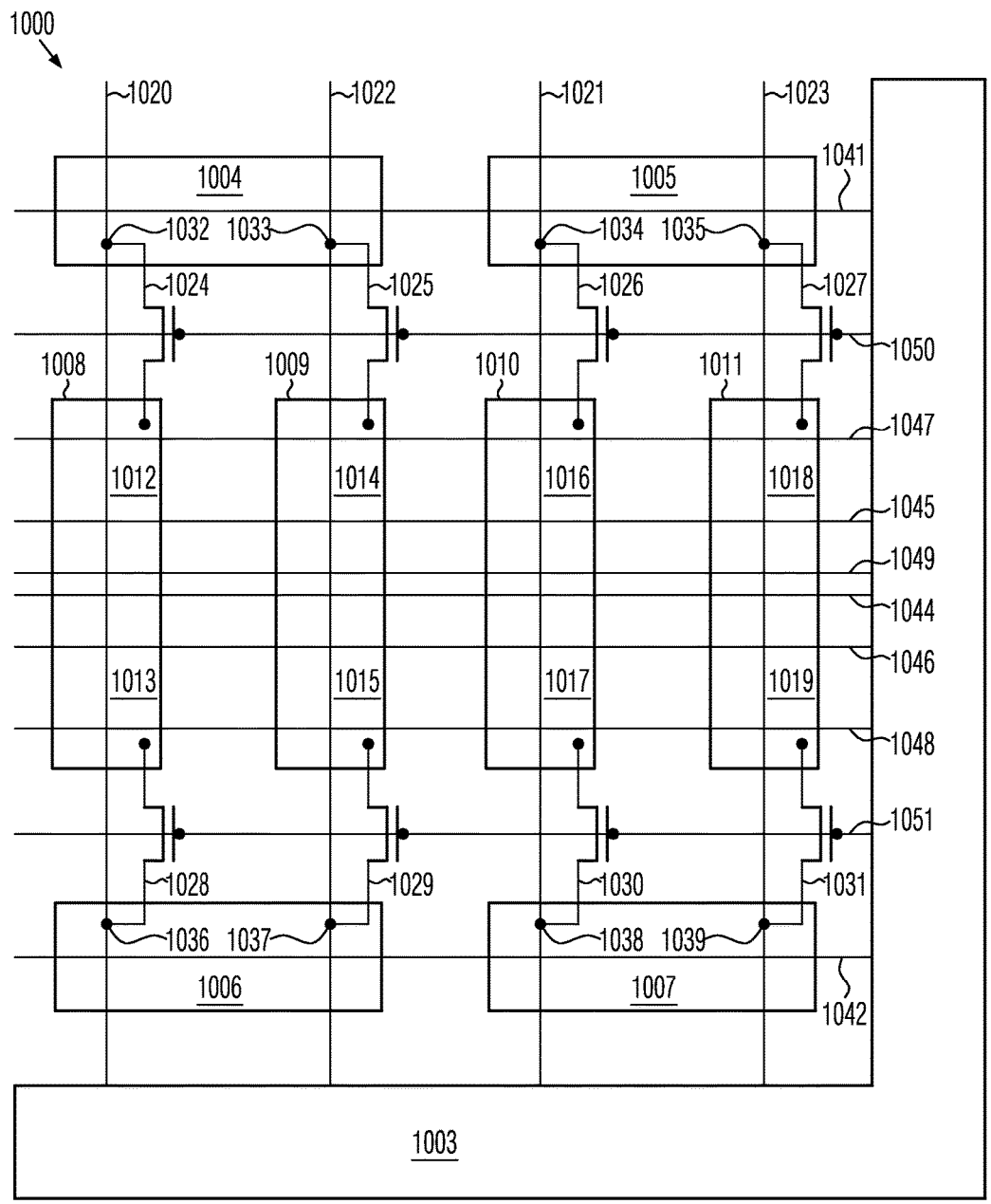
FIG. 10 shows a schematic circuit diagram of a nonvolatile static random access memory circuit provided on a semiconductor structure according to an embodiment.

FIG. 10 shows a schematic circuit diagram of a nonvolatile static random access memory (NVSRAM) circuit 1000. The NVSRAM circuit 1000 may include a plurality of static random access memory (SRAM) cells 1004, 1005, 1006, 1007. Each of the SRAM cells 1004 to 1007 may have a configuration in accordance with a known configuration of SRAM cells. For example, each of the SRAM cells 1004 to 1007 may be a conventional six transistor SRAM cell.

Additionally, the NVSRAM circuit 1000 may include a plurality of nonvolatile memory cells 1008, 1009, 1010, 1011. Each of the nonvolatile memory cells 1008 to 1011 may have a configuration corresponding to the configuration of the nonvolatile memory cell 807 described above with reference to FIGS. 1-9. In particular, each of the nonvolatile memory cells 1008 to 1011 may include two nonvolatile bit storage elements having a configuration corresponding to the configuration of the nonvolatile bit storage elements 808, 809 of the nonvolatile memory cell 807. In FIG. 10, reference numerals 1012, 1013 denote the nonvolatile bit storage elements of the nonvolatile memory cell 1008, reference numerals 1014, 1015 denote the nonvolatile bit storage elements of the nonvolatile memory cell 1009, reference numerals 1016, 1017 denote the nonvolatile bit storage elements of the nonvolatile memory cell 1010, and reference numerals 1018, 1019 denote the nonvolatile bit storage elements of the nonvolatile memory cell 1011.

Similar to the nonvolatile memory cell 807 described above with reference to FIGS. 1-9, each of the nonvolatile memory cells 1008 to 1011 may include source regions, select gates, erase gates, floating gates and control gates, wherein the source regions, select gates, erase gates and control gates of adjacent ones of the nonvolatile memory cells 1008 to 1011 may be contiguous with each other. In FIG. 10, reference numeral 1044 denotes the control gates of the nonvolatile memory cells 1008 to 1011, reference numeral 1049 denotes the source regions, reference numeral 1045 denotes the select gates of the nonvolatile bit storage elements 1012, 1014, 1016, 1018, reference numeral 1047 denotes the erase gates of the nonvolatile bit storage elements 1012, 1014, 1016, 1018, reference numeral 1046 denotes the select gates of the nonvolatile bit storage elements 1013, 1015, 1017, 1019 and reference numeral 1048 denotes the erase gates of the nonvolatile bit storage elements 1013, 1015, 1017, 1019. The control gates 1044, select gates 1045, 1046, erase gates 1047, 1048 and source regions 1049 may be connected to a control circuit 1003.

The NVSRAM circuit 1000 may further include bitlines 1020, 1021 and inverse bitlines 1022, 1023. Each of the SRAM cells 1004 to 1007 may be connected to one of the bitlines 1020, 1021 and one of the inverse bitlines 1022, 1023. Additionally, the NVSRAM circuit 1000 may include word lines 1041, 1042, wherein each of the SRAM cells 1004 to 1007 may be connected to one of the word lines 1041, 1042. The bitlines 1020, 1021, inverse bitlines 1022, 1023 and word lines 1041, 1042 may be connected to the control circuit 1003.

Each of the SRAM cells 1004 to 1007 may have a bitline connection node (denoted by reference numerals 1032, 1034, 1036 and 1038, respectively) and an inverse bitline connection node (denoted by reference numerals 1033, 1035, 1037, 1039, respectively). Voltages at the bitline connection nodes 1032, 1034, 1036, 1038 and the inverse bitline connection nodes 1033, 1035, 1037, 1039 may be representative of a value of a data bit stored in the respective one of the SRAM cells 1004 to 1007. The voltages at the bitline connection nodes 1032, 1034, 1036, 1038 and the inverse bitline connection nodes 1033, 1035, 1037, 1039 may be approximately equal to one of a high voltage value and a low voltage value, wherein, in each of the SRAM cells, the voltage at the inverse bitline connection node is approximately equal to the low voltage value when the voltage at the bitline connection node of the SRAM cell is approximately equal to the high voltage value, and vice versa.

Each of the bitline connection nodes 1032, 1034, 1036, 1038 and inverse bitline connection nodes 1033, 1035, 1037, 1039 may be associated with a respective one of the nonvolatile bit storage elements 1012 to 1019 of the nonvolatile memory cells 1008 to 1011, and may be connected to the associated nonvolatile bit storage element by means of a respective one of a plurality of access transistors 1024, 1025, 1026, 1027, 1028, 1029, 1030, 1031. Gate electrodes of the access transistors 1024 to 1031 may be connected to access control lines 1050, 1051, which may be connected to the control circuit 1003. By applying appropriate voltages to the access control lines 1050, 1051, the access transistors 1024 to 1031 may be switched into an electrically conductive state, wherein they may provide a connection between one of the bitline connection nodes 1032, 1034, 1036, 1038 and inverse bitline connection nodes 1033, 1035, 1037, 1039 and the drain region of the nonvolatile bit storage element associated therewith.

The SRAM cells 1004 to 1007 and the nonvolatile memory cells 1008 to 1011 may be arranged in a row extending along a word line direction 1001 (horizontal in the plane of drawing of FIG. 10). In addition to the elements shown in FIG. 10, the row may include further SRAM cells and nonvolatile memory cells. Moreover, the NVSRAM circuit 1000 may include further rows, in addition to the row shown in FIG. 10, which are spaced apart from each other in a bitline direction 1002 that is substantially perpendicular to the wordline direction 1001. The word lines 1041, 1042, control gates 1044, select gates 1045, 1046, erase gates 1047, 1048 and source regions 1049, as well as the access control lines 1050, 1051 may extend in the word line direction 1001. The bitlines 1020, 1021 and inverse bitlines 1022, 1023 may extend in the bitline direction 1002. Thus, the NVSRAM circuit 1000 may include an array of SRAM cells and nonvolatile memory cells.

The SRAM cells 1004 to 1007 of the NVSRAM circuit may be used for storing bits of data, wherein one bit of data may be stored in each of the SRAM cells 1004 to 1007. Operations for reading data from the SRAM cells 1004 to 1007 and for writing data to the SRAM cells 1004 to 1007 may correspond to those used in conventional SRAM circuits, wherein the SRAM cells 1004 to 1007 may be accessed by the control circuit 1003 via the bitlines 1020, 1021, inverse bitlines 1022, 1023 and word lines 1041, 1042. During the read and write operations, the access transistors 1024 to 1031 may be switched into an off state by the control circuit 1003 via the access control lines 1050, 1051 so that the nonvolatile memory cells 1008 to 1011 are disconnected from the SRAM cells 1004 to 1007.

In addition to operations for reading data from and writing data to the SRAM cells 1004 to 1007, data from the SRAM cells 1004 to 1007 may be stored into the nonvolatile bit storage elements 1012 to 1019 of the nonvolatile memory cells 1008 to 1011, and data from the nonvolatile bit storage elements 1012 to 1019 may be recalled into the SRAM cells 1004 to 1007. For each of the SRAM cells 1004 to 1007, two bits of data corresponding to the voltage values at the bitline connection nodes 1032, 1034, 1036, 1038 and inverse bitline connection nodes 1033, 1035, 1037, 1039 may be stored in the nonvolatile memory cells 1008 to 1011. Since each of the nonvolatile memory cells 1008 to 1011 may store two bits of data, a number of nonvolatile memory cells and a number of SRAM cells in the NVSRAM circuit 1000 may be substantially equal. For storing data from the SRAM cells 1004 to 1007 in the nonvolatile memory cells 1008 to 1011, the access transistors 1024 to 1031 may be switched into an electrically conductive on state, and voltages for programming the nonvolatile bit storage elements 1012 to 1019 may be applied to the control gates 1044, select gates 1045, 1046, erase gates 1047, 1048 and source regions 1049 by the control circuit 1003. Depending on the voltages applied at the drain regions of the nonvolatile bit storage elements 1012 to 1019 though the access transistors 1024 to 1031, electrons may be injected into the floating gates of the nonvolatile bit storage elements 1012 to 1019, so that the floating gates of the nonvolatile bit storage elements 1012 to 1019 are charged in accordance with the voltages at the respective ones of the bitline connection nodes 1032, 1034, 1036, 1038 and inverse bitline connection nodes 1033, 1035, 1037, 1039 associated therewith.

For recalling data from the nonvolatile memory cells 1008 to 1011 into the SRAM cells 1004 to 1007, voltages adapted for reading data from the nonvolatile bit storage elements 1012 to 1019 may be applied to the control gates 1044, select gates 1045, 1046, erase gates 1047, 1048 and source regions 1049, and the access transistors 1024 to 1031 may be switched into the electrically conductive on state by the control circuit 1003, so that voltages depending on the electric charge in the floating gates of the nonvolatile bit storage elements 1012 to 1019 are applied at the bitline connection nodes 1032, 1034, 1036, 1038 and inverse bitline connection nodes 1033, 1035, 1037, 1039 of the SRAM cells.

Furthermore, the control circuit 1003 may apply voltages for erasing the nonvolatile bit storage elements 1012 to 1019 of the nonvolatile memory cells 1008 to 1011 to the control gates 1044, select gates 1045, 1046, erase gates 1047, 1048 and source regions 1049 after recalling the data into the SRAM cells 1004 to 1007 so that the nonvolatile memory cells 1008 to 1011 are ready for a new storage operation.

The transfer of data between the SRAM cells 1004 to 1007 and the nonvolatile memory cells 1008 to 1011 may be performed in a highly parallel manner, so that only a small amount of time is required therefor. Thus, data from the SRAM cells 1004 to 1007 may be quickly stored in the nonvolatile memory cells 1008 to 1011 in the case of a power failure, and may be read back quickly after the reestablishment of the power supply.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor structure, comprising:
    a nonvolatile memory cell comprising a first nonvolatile bit storage element and a second nonvolatile bit storage element, said first and second nonvolatile bit storage elements having a common source region provided in a semiconductor material and a common control gate structure, each of said first and second nonvolatile bit storage elements comprising:
    a drain region and a channel region provided in said semiconductor material, said channel region having a select gate side portion and a floating gate side portion;
    a select gate structure at said select gate side portion of said channel region;
    a floating gate structure at said floating gate side portion of said channel region; and
    an erase gate structure above said select gate structure and adjacent said floating gate structure;
    wherein said floating gates for said first and second nonvolatile bit storage elements are separated by an isolation region, said floating gates for said first and second nonvolatile bit storage elements isolation structure have coplanar upper surfaces, and said common control gate structure is disposed on said coplanar upper surfaces and extends above said floating gate structures of said first and second nonvolatile bit storage elements.

2. The semiconductor structure of claim 1, wherein said select gate structure is provided in a trench formed in said semiconductor material.

3. The semiconductor structure of claim 1, wherein at least one of said erase gate structure, said select gate structure and said control gate structure comprises an electrically conductive metal.

4. The semiconductor structure of claim 1, wherein each of said erase gate structure, said select gate structure and said control gate structure comprises said electrically conductive metal, said electrically conductive metal comprising tungsten.

5. The semiconductor structure of claim 1, wherein said control gate structure comprises a portion above said source region.

6. The semiconductor structure of claim 1, wherein said erase gate structure of said first nonvolatile bit storage element and said erase gate structure of said second nonvolatile bit storage element are arranged on opposite sides of said source region.

7. The semiconductor structure of claim 1, wherein each of said first and second nonvolatile bit storage elements comprises a tunnel layer arranged at a side of said floating gate structure facing said erase gate structure.

8. The semiconductor structure of claim 1, further comprising circuitry comprising at least one of a logic circuit and a static random access memory circuit, said circuitry comprising:
    a field effect transistor, said field effect transistor comprising one of a high-k metal gate structure and a polysilicon silicon oxynitride gate structure;
    wherein said high-k metal gate structure comprises a gate insulation layer comprising a high-k dielectric material having a greater dielectric constant than silicon dioxide and a gate electrode comprising a metal; and
    wherein said polysilicon silicon oxynitride gate structure comprises a gate insulation layer comprising silicon oxynitride and a gate electrode comprising polysilicon.

9. A semiconductor structure, comprising:
    a plurality of static random access memory cells, each of said plurality of static random access memory cells having a bitline connection node and an inverse bitline connection node; and
    a plurality of nonvolatile memory cells, each of said plurality of nonvolatile memory cells comprising a first nonvolatile bit storage element and a second nonvolatile bit storage element, said first and second nonvolatile bit storage elements having a common source region provided in a semiconductor material and a common control gate structure, each of said first and second nonvolatile bit storage elements comprising:
    a drain region and a channel region provided in said semiconductor material, said channel region having a select gate side portion and a floating gate side portion;
    a select gate structure provided in a trench in said semiconductor material at said select gate side portion of said channel region;
    a floating gate structure at said floating gate side portion of said channel region; and an erase gate structure above said select gate structure and adjacent said floating gate structure;

wherein said floating gates for said first and second nonvolatile bit storage elements are separated by an isolation region, said floating gates for said first and second nonvolatile bit storage elements isolation structure have coplanar upper surfaces, and said common control gate structure extends above said floating gate structures of said first and second nonvolatile bit storage elements;

wherein each of said bitline connection nodes and said inverse bitline connection nodes of said plurality of static random access memory cells is coupled to a drain region of a respective one of said nonvolatile bit storage elements of said plurality of nonvolatile memory cells; and wherein said semiconductor structure comprises a drive circuit for performing a storage operation wherein a data bit indicative of a respective voltage at each of said bitline connection nodes and said inverse bitline connection nodes is stored in said one of said nonvolatile bit storage elements associated therewith and a recall operation wherein a respective voltage at each of said bitline connection nodes and said inverse bitline connection nodes is set on the basis of said data bit stored in said one of said nonvolatile bit storage elements associated therewith.

10. The semiconductor structure of claim 9, wherein at least one of said erase gate structure, said select gate structure and said control gate structure comprises an electrically conductive metal.

11. The semiconductor structure of claim 9, wherein each of said erase gate structure, said select gate structure and said control gate structure comprises said electrically conductive metal, said electrically conductive metal comprising tungsten.

12. The semiconductor structure of claim 9, wherein said control gate structure comprises a portion above said source region.

13. The semiconductor structure of claim 9, wherein said erase gate structure of said first nonvolatile bit storage element and said erase gate structure of said second nonvolatile bit storage element are arranged on opposite sides of said source region.

14. The semiconductor structure of claim 9, wherein each of said first and second nonvolatile bit storage elements comprises a tunnel layer arranged at a side of said floating gate structure facing said erase gate structure.

15. The semiconductor structure of claim 9, further comprising circuitry comprising at least one of a logic circuit and a static random access memory circuit, said circuitry comprising:

a field effect transistor, said field effect transistor comprising one of a high-k metal gate structure and a polysilicon silicon oxynitride gate structure;

wherein said high-k metal gate structure comprises a gate insulation layer comprising a high-k dielectric material having a greater dielectric constant than silicon dioxide and a gate electrode comprising a metal; and wherein said polysilicon silicon oxynitride gate structure comprises a gate insulation layer comprising silicon oxynitride and a gate electrode comprising polysilicon.

* * * * *